United States Patent [19]

Ikeno et al.

[11] Patent Number: 4,960,658

[45] Date of Patent: Oct. 2, 1990

[54] COLOR FILTER DYEING APPARATUS

[75] Inventors: Masahiko Ikeno; Hideo Saeki, both of Itami, Japan

[73] Assignee: Mitsubishi Denki Kabushiki Kaisha, Tokyo, Japan

[21] Appl. No.: 260,870

[22] Filed: Oct. 21, 1988

Related U.S. Application Data

[62] Division of Ser. No. 941,042, Dec. 12, 1986, Pat. No. 4,821,675.

[30] Foreign Application Priority Data

Dec. 16, 1985 [JP] Japan .............................. 60-282576

[51] Int. Cl.[5] .............................................. G03F 9/00

[52] U.S. Cl. .......................................... 430/7; 430/30; 430/321; 430/325

[58] Field of Search ................. 430/4, 7, 30, 293, 294, 430/32 P, 325, 331; 487/240; 354/320, 325, 329, 330; 8/507, 502, 518, 150

[56] References Cited

U.S. PATENT DOCUMENTS 755,349 3/1904 Bornman .............................. 118/54

2,158,981 5/1939 Collins et al. ......................... 427/80

3,008,601 11/1961 Cahne ................................. 220/458

3,839,991 10/1974 Winstel et al. ....................... 118/620

4,418,639 12/1983 Wills et al. ........................... 118/50

OTHER PUBLICATIONS

Koike et al., "Heat- and Light-Resistance Characteristics of an MOS Imaging Device with Monolithically Integrated Color Filters", IEEE Transactions of Electron Devices, 32:1475-1479, (1985).

*Primary Examiner*—Jose Dees

*Assistant Examiner*—J. Weddington

*Attorney, Agent, or Firm*—Saidman, Sterne, Kessler & Goldstein

[57] ABSTRACT

A color filter dyeing apparatus for dyeing a color filter formed on a substrate comprises a chuck for holding the substrate on which the color filter is mounted, a dyeing solution receptacle in intimate engagement, by means of a sealing member, with the chuck or the substrate, and forming a container for containing the color filter therein, an inlet for supplying the dyeing solution into the container, and means for discharging the dyeing solution from the container.

27 Claims, 8 Drawing Sheets

(PROCESSING SUBSTRATES ONE AT A TIME)

(BATCH PROCESSING)

COLOR FILTER DYEING APPARATUS

This application is a division, of application Ser. No. 941,042, filed 12-12-86 now U.S. Pat. No. 4,821,675.

BACKGROUND OF THE INVENTION

The present invention relates to a color filter dyeing apparatus for dyeing a color filter formed on a substrate, such as a glass substrate or a semiconductor substrate. The invention is particularly suitable for dyeing an on-chip filter.

Conventionally, in the process of fabrication of on-chip-type color filters for a solid-state imager or color filters for a liquid crystal color TV set, substrates on which layers or patterns (which are to be dyed afterward) of a material such as gelatin and casein are soaked in a dyeing solution bath. Tens of substrates are processed at a time, i.e., in a batch. As an example, the substrate process for dyeing a color filter on a semiconductor substrate forming a solid-state imager is shown in FIG. 9. Usually each batch consists of twenty five substrates, which are soaked in the dyeing solution (step 51). The substrates are then rinsed (step 52) to prevent residue of unnecessary dye on the substrate. The substrates are then dryed (step 53) by spin dry method or the like.

FIG. 10 shows an example of a conventional color filter dyeing apparatus for dyeing color filters i.e., layers or patterns to be dyed which themselves are not illustrated as such and which are formed on the substrates 6. The dyeing apparatus comprises a dyeing solution bath 31 filled with a dyeing solution 5, a recovery bath 32 for recovering or collecting the dyeing solution which have overflown the dyeing solution bath 31, and a circulating pump 33 for feeding the dyeing solution from the recovery bath 32 to the dyeing solution bath 31. A substrate support member 34 holds the substrates in alignment. Several to several tens of substrates can be held at the same time. A transfer member 35 for transferring the substrates is mounted to the support member 34. A draining board 36 is disposed at the bottom of the dyeing solution bath 31.

In operation, the dyeing solution bath 31 is continuously fed with a new dyeing solution 5 by means of the circulating pump 33. The dyeing solution having overflown is recovered into the recovery bath 32. The dyeing solution 5 in the recovery bath 32 is again fed back by the circulating pump 33 and is fed into the dyeing solution bath 31. Thus the dyeing solution 5 is always circulated. The draining board 36 diverges the flow of the dyeing solution flowing through the inlet into the dyeing solution bath 31 thereby distributing the flow throughout the dyeing solution bath 31. It also prevents the support member 34 from being too low or approaching the bottom too closely. The support member 34 on which the substrates 6 are arranged is transferred, manually or by means of a transfer mechanism not shown, into the dyeing solution bath 31. The color filters on the substrates are soaked in the dyeing solution 5 and are thereby dyed. Upon expiration of a predetermined time, the support member with the substrates are transferred out of the dyeing solution bath 31, in a manner similar to that in which it was transferred in, and is then transferred to a rinsing step 52.

Shortcomings of the above-described conventional apparatus are: (i) that continuous processing cannot be made; (ii) that the concentration and characteristics of the dyeing solution vary through repeated use of the dyeing solution, so that the characteristics (particularly the spectral characteristics) of the resultant color filters fluctuates; and (iii) that, when the agitation or stirring of the dyeing solution in the dyeing solution bath is insufficient, the uniformity in the temperature, pH and the like deteriorates and the characteristics of the resultant color filters may vary depending on the position within the support member.

SUMMARY OF THE INVENTION

An object of the present invention is to solve the above-described problems.

Another object of the invention is to provide an apparatus which dyes color filters one by one, and to enable continuous processing from development of layers or patterns to be dyed, formed of a material such as gelatin, casein or the like, to drying.

A further object of the invention is to restrain variation in the temperature of the dyeing solution which causes fluctuation in the color filter characteristic.

A still further object of the invention is to restrain variation in the concentration of the dyeing solution.

A further object of the invention is to eliminate residue of the dyeing solution on the substrate, and reduction in the efficiency of dyeing and to restrain fluctuation in the color filter characteristic.

A color filter dyeing apparatus according to the invention is characterized in that a substrate is held on a chuck, the substrate or the chuck is disposed in sealing relation with the dyeing solution receptacle by means of a sealing member, so that a generally cup-shaped container is formed of the substrate or the chuck and the dyeing solution receptacle, and there are provided an inlet for supplying the dyeing solution in the container and means for discharging the dyeing solution from the container.

In an embodiment of the invention, there is further provided an upper lid in engagement with the dyeing solution receptacle, to enclose the cup-shaped container.

A temperature controller such as one having a heater or a cooler (e.g., a pipe conducting a coolant) may also be provided to restrain variation in temperature of the dyeing solution.

An agitator such as an impeller may further be provided to agitate the dyeing solution.

With the above-described arrangement, each substrate transferred by a transfer mechanism is fixed onto the chuck, and the substrate or the chuck is disposed onto the dyeing solution receptacle in a sealing relation by means of a sealing member, so that a generally cup-shaped container, with the substrate or the chuck forming at least part of the bottom, is formed. The dyeing solution is supplied into the container thus formed through the inlet so that the color filter layer or the color filter pattern on the upper surface of the substrate is soaked in the dyeing solution to be dyed. After the completion of dyeing, the dyeing solution is discharged.

The upper lid, in engagement with the dyeing solution receptacle, forms an enclosure with the dyeing solution receptacle and the substrate or the chuck, so that variation in the concentration of the dyeing solution due to volatilization of the solvent in the dyeing solution and the variation in the temperature of the dyeing solution due to evaporation heat are prevented.

By the use of the temperature controller such as a one having heater, a cooler or the like mounted to the dyeing solution receptacle, the chuck or the upper lid, the temperature of the dyeing solution is controlled at a predetermined value and the temperature variation is restrained.

By the use of the agitator for agitating the dyeing solution on the substrate, the dyeing solution is prevented from stagnating, so that reduction in the efficiency of the dyeing and fluctuation in the resultant characteristic of the color filter are avoided.

DETAILED DESCRIPTION OF THE PREFERRED EMBODIMENTS

Figure 1:
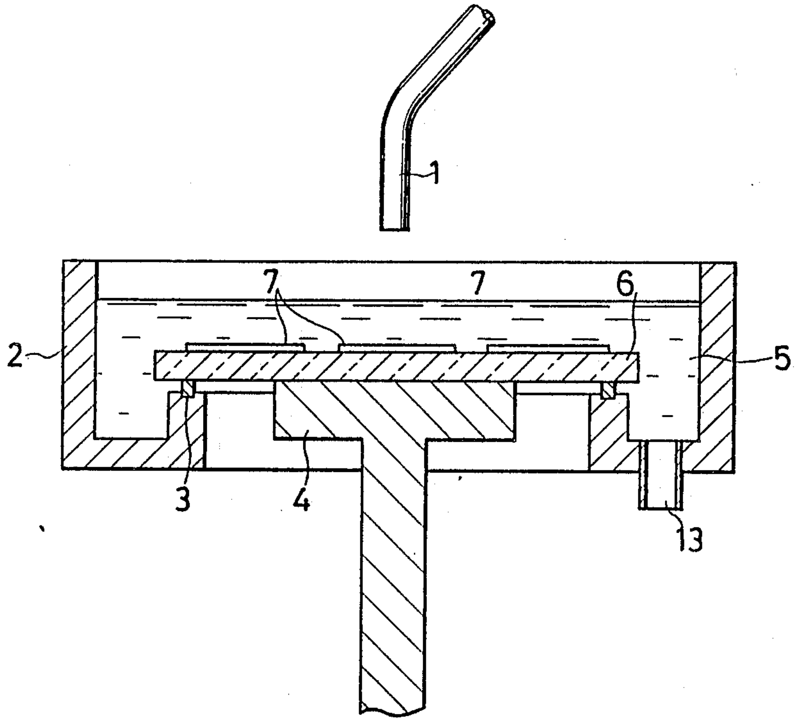
FIG. 1 is a sectional view showing a color filter dyeing apparatus of an embodiment of the invention.

A color filter dyeing apparatus of an embodiment of the invention is shown in FIG. 1. As illustrated, it comprises an inlet (supply nozzle) 1 for supplying a dyeing solution 5, a dyeing solution receptacle 2 in sealing relation with a substrate 6 by means of a sealing member 3, and a vacuum suction chuck 4 for fixedly supporting the substrate 6. The substrate 6 is, in the example illustrated, a glass substrate and has a color filter 7, i.e., a layer or a pattern to be dyed, formed of gelatin, casein or the like, and formed on the substrate 6. There is further provided an outlet or drain 13 for discharging the dyeing solution. The outlet is provided with a valve such as an electromagnetic valve, not shown.

As the substrate 6 and the dyeing solution receptacle 2 are disposed in sealing relation with each other by means of the sealing member 3, a generally cup-shaped container is formed of these members. Therefore, when the dyeing solution 5 is introduced through the inlet 1, the container is filled with the dyeing solution 5, and the color filter 7 is soaked in the dyeing solution 5 to be dyed.

The chuck 4 attract the substrate 6 by vacuum suction with a force sufficient to hold the substrates and to compress the sealing member 3 between the substrate 6 and the dyeing solution receptacle 2 to reduce the leakage of the dyeing solution.

Figures 2A, 2B, 2C, 2D, 2E, 2F:
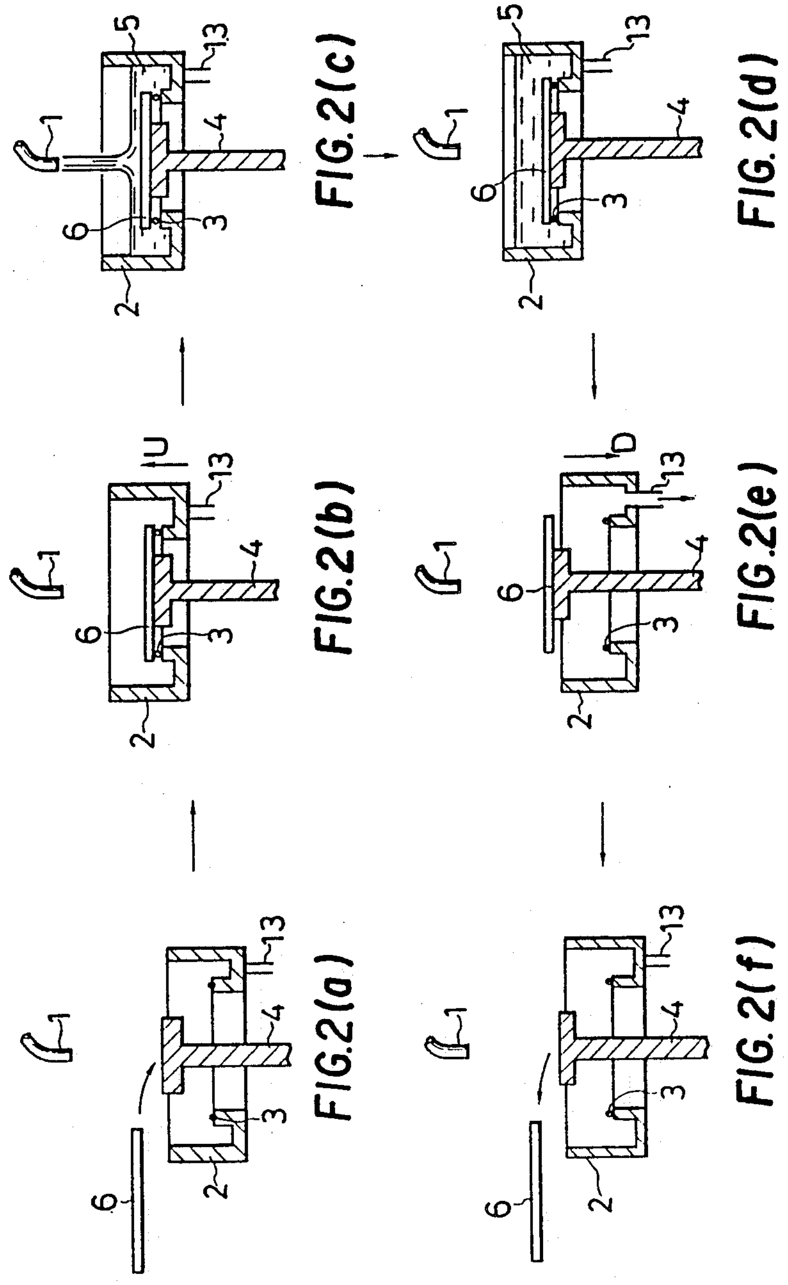
FIG. 2(*a*) through 2(*f*) are diagrams illustrating the process of the color filter dyeing according to the embodiment of FIG. 1.

The sequence or procedure for the dyeing using the color filter dyeing apparatus of FIG. 1 will be described with reference to FIG. 2. In FIG. 2, a color filter on the substrate 6 is omitted from illustration. The reference numerals 1–4, 6 and 13 denote identical members as in FIG. 1.

The substrate 6 having a color filter, not shown, formed thereon is transferred manually or by a transfer mechanism onto the chuck 4 as illustrated in FIG. 2 at (a). Then, the substrate 6 is fixed by vacuum suction onto the chuck 4, and the dyeing solution receptacle 2 is lifted, as indicated by an arrow U in FIG. 2 at (b), so that the sealing member 3 is brought into engagment with the lower (or rear) surface of the substrate 6, and a container for the dyeing solution is formed of the dyeing solution receptacle 2, the sealing member 3 and the substrate 6, Then, the dyeing solution 5 is poured into the container, as illustrated at (c), and the color filter on the substrate 6 is soaked in the dyeing solution 5 and is dyed, as illustrated at (d).

Upon expiration of a predetermined time, a valve, not shown, provided on the outlet 13 is opened and the dyeing solution 5 is discharged, and the dyeing solution receptacle 2 is lowered as indicated by an arrow D in FIG. 2 at (e). Then, the suction of the substrate 6 is terminated and the substrate 6 is taken out manually or by a transfer mechanism, as illustrated at (f). By repeating the above-described sequence, substrates are continuously dyed one by one.

The above-described embodiment is advantageous in that the substrates can be treated one by one and the steps for producing a color filter can be continuously performed.

Figure 3:
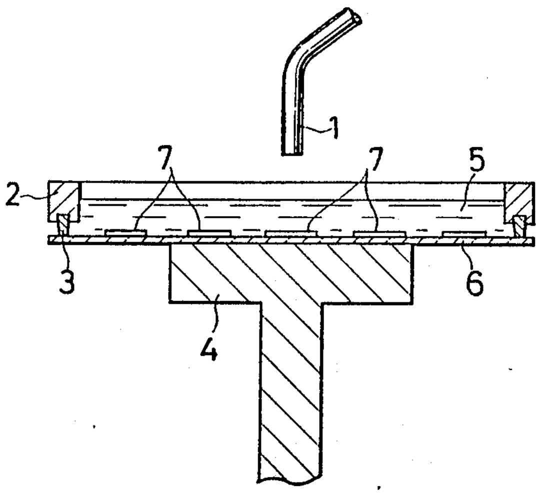
FIGS. 3 through 5 are sectional views showing respectively color filter dyeing apparatus of other embodiments of the invention.

In the embodiment described above, the sealing member is provided in engagement with the lower surface of the substrate. But the arrangement may be alternatively such that the sealing member is in engagement with the upper surface of the substrate at the peripheral portion thereof, as illustrated in FIG. 3, in which a color filter on a semiconductor substrate 6 is shown to be dyed. As with the sealing member 3, the dyeing solution receptacle 2 is also disposed above the substrate. With such an arrangement, the volume of the container formed of the dyeing solution receptacle 2, the sealing member 3 and the substrate 6 can be minimized, so that the quantity of the dyeing solution 5 used per substrate can be reduced. The direction of the movement of the dyeing solution receptacle 2 at the time of the transfer of the substrate onto and from the chuck 4 should be opposite to those of the embodiment of FIG. 1. No special outlet is needed but the dyeing solution 5 is discharged through the gap between the sealing member 3 and the substrate 6 which is formed when the dyeing solution receptacle 2 is lifted.

Figure 4:
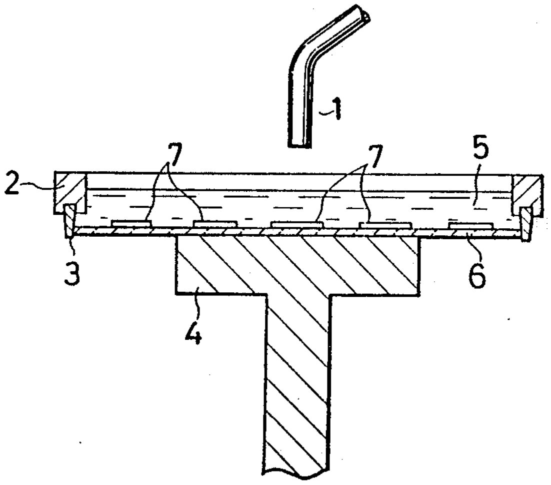

In the embodiments of FIGS. 1 and 3, the sealing member 3 is disposed on the lower surface and the upper surface of the substrate 6, respectively. But the arrangement may still alternatively be such that the sealing member 3 is in engagement with the side surface, i.e., edge of the substrate 6, as illustrated in FIG. 4.

Figure 5:
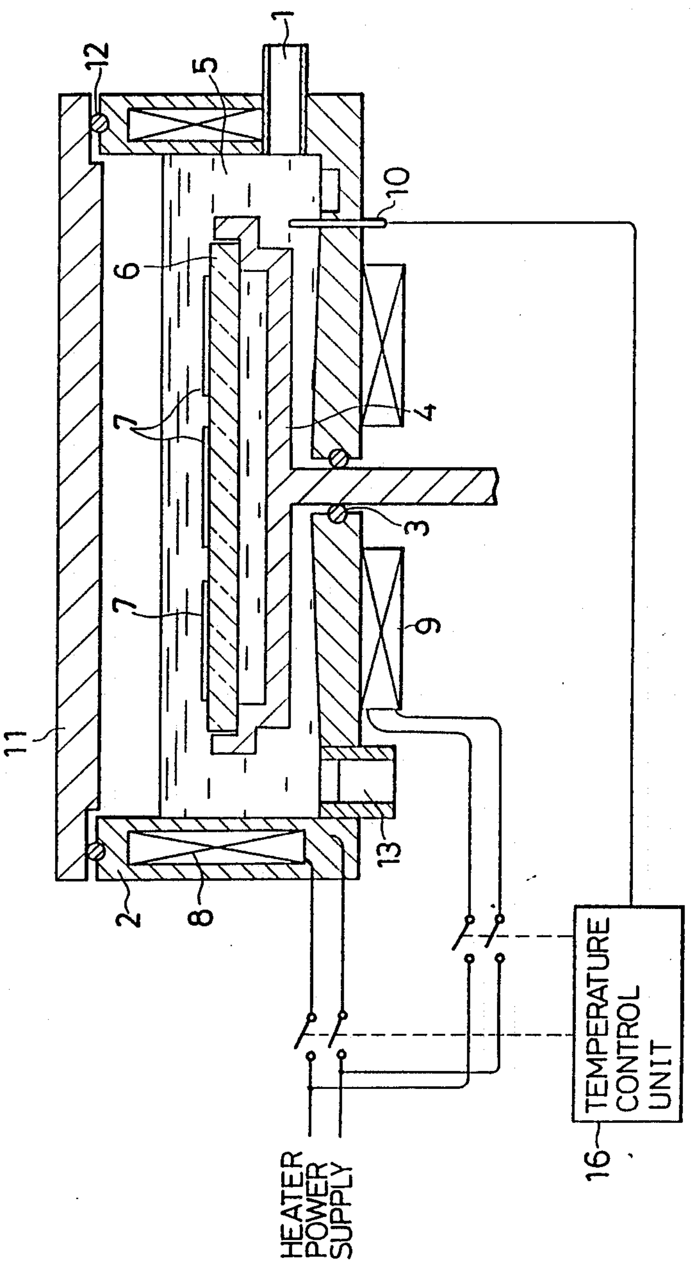

FIG. 5 shows another embodiment of the invention having additional functions of controlling the temperature of the dyeing solution and of preventing volatilization of the solvent of the dyeing solution. The members with reference numerals 1 through 7 have functions similar to those of the members in FIG. 1 with identical reference numerals. But the chuck 4 is a mechanical chuck, and the inlet 1 penetrates through the dyeing solution receptacle 2, and is connected through a valve, such as a solenoid valve not shown, to a dyeing solution tank, also not shown. There are further provided a heater 8 buried in the side part of the dyeing solution receptacle 2, another heater 9 disposed on the lower surface of the dyeing solution receptacle 2 and a temperature sensor mounted to penetrate the dyeing solution receptacle 2. There are further provided an upper lid 11 in engagement with the dyeing solution receptacle 2 by means of a sealing member 12, and an outlet 13 connected through a valve, such as a solenoid valve to the outside.

According to the embodiment of FIG. 5, the heaters 8 and 9 can be used to vary the temperature of the dyeing solution receptacle 2 and hence the temperature of the dyeing solution 5. The temperature sensor 10 is used to measure the temperature of the dyeing solution and an electrical signal indicative of the temperature is fed to a temperature control unit 16, which provides an ON/OFF signal for each of the heaters 8 and 9. The ON/OFF signals are used to selectively connect or disconnect the heaters to or from an electric power supply not shown. Through such a control, the temperature of the dyeing solution is controlled at a desired value.

The lid 11 is mounted to be in engagement on a sealing member 12 on the dyeing solution receptacle 2, so that an enclosure is formed by the dyeing solution receptacle 2, the sealing member 3, the chuck 4 and the lid 11. As a result, volatilization of the solvent (water, in many cases) of the dyeing solution 5 which has been heated by the heaters 8 and 9 can be restrained, and hence variation in the concentration of the dyeing solution can be prevented.

The supply and discharge of the dyeing solution through the inlet and the outlet are done by opening and closing the respective electromagnetic valves.

Figures 6A, 6B, 6C, 6D, 6E, 6F:
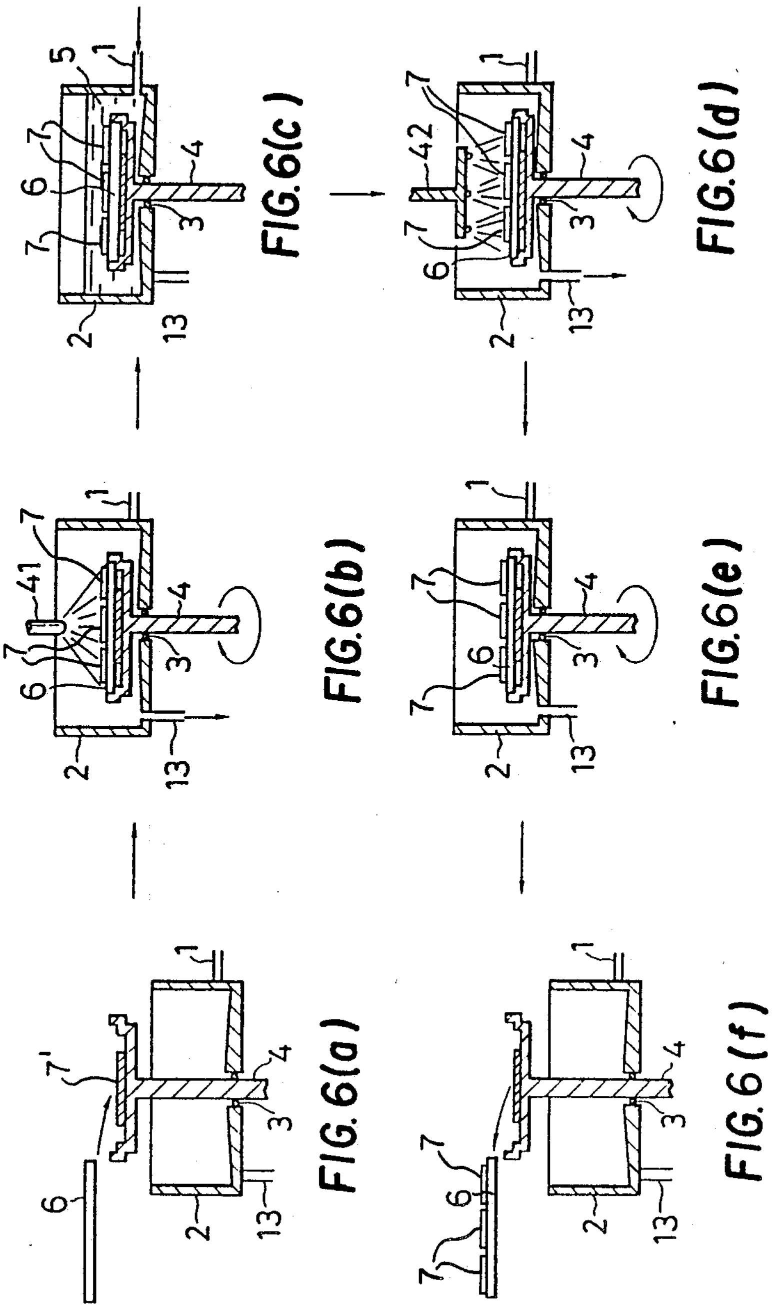
FIG. 6(*a*) through 6(*f*) are a diagrams showing the sequence of continuous processing from the development to the drying according to an embodiment of the invention.

FIG. 6 shows an arrangement for performing developing and rinsing as well as soaking the substrate in the dyeing solution. In FIG. 6, illustration of the heaters 8 and 9, the upper lid 11 and the sealing member 12 shown in FIG. 5 is omitted. Generally, color filters (layers or patterns to be dyed) are obtained by exposing to water soluble photosensitive film of gelatin or casein using a mask pattern to transfer the mask pattern and then developing it by water. FIG. 6 shows the process sequence including such developing process.

Figure 8:
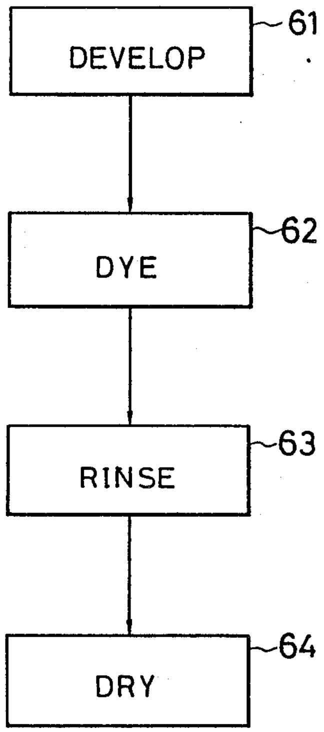
FIG. 8 is a flowchart showing the process from the development to the drying according to an embodiment of the invention.
Figure 9:
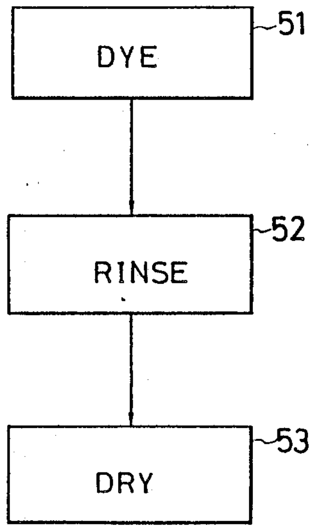
FIG. 9 PRIOR ART
FIG. 9 is a flowchart showing a conventional process from the dyeing to the drying.
Figure 10:
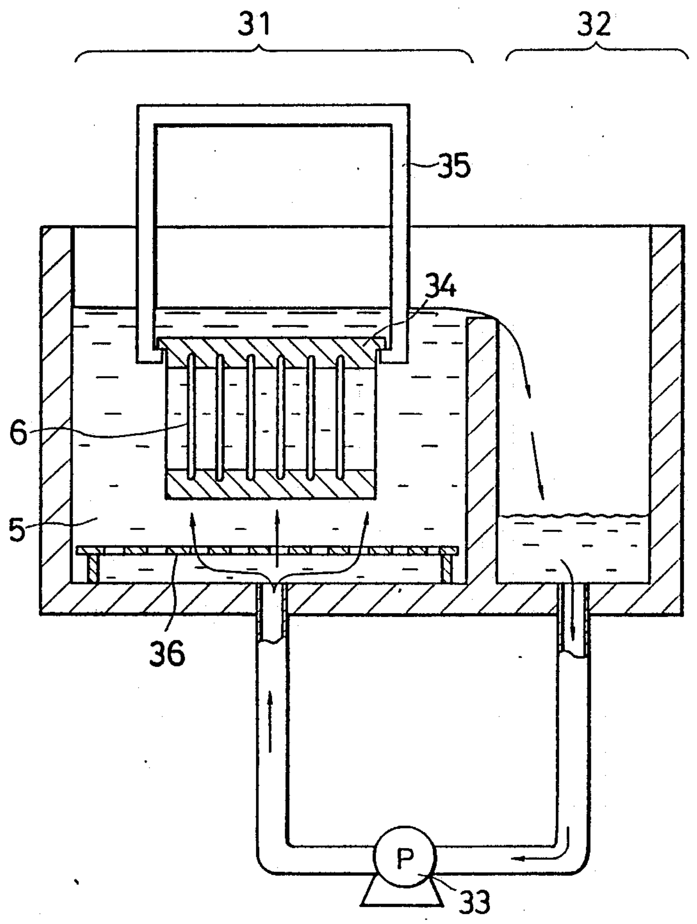
FIG. 10 PRIOR ART
FIG. 10 is a sectional view showing a conventional dyeing apparatus.

First, a substrate 6 with its photosensitive film (not shown) of gelatin or the like having been subjected to pattern-exposure to light is transferred and fixed onto a chuck as illustrated in FIG. 6 at (a), in a manner similar to that described with reference to FIG. 2. Then, as shown in FIG. 6 at (b), the dyeing solution receptacle 2 is lifted and the outlet 13 is opened, and developing solution (aqueous) is sprayed by a developing nozzle 41 disposed over the substrate 6 to develop photosensitive film on the substrate 6, thereby to obtain a color filter 7. During such processing, the chuck 4 is generally rotated and the developing solution which has dropped onto the dyeing solution receptacle 2 is discharged through the outlet 13, as illustrated in FIG. 6 (*b*). Subsequently, the outlet 13 is closed and the dyeing solution 5 is supplied through the inlet 1, so that the color filter 7 is soaked in the dyeing solution 5 to be dyed, as illustrated at (c). During the dyeing, the substrate 6 may or may not be rotated. After that, the outlet 13 is again opened to discharge the dyeing solution, and then water is sprayed through a rinsing nozzle 42 to wash away any residual dyeing solution 5 away from the substrate 6, as illustrated at (d). Subsequently, the substrate 6 is rotated at a high speed to be dried, as illustrated at (e). Subsequently, the dyeing solution receptacle 2 is lowered and the suction of the substrate 6 is released, and the substrate 6 is taken out, as illustrated at (f). In this way, the sequence of steps 61 through 64 of developing, dyeing, rinsing and drying, as shown in FIG. 8 is continuously achieved.

As has been described, with the embodiment of FIG. 5, heaters are mounted on the dyeing solution receptacle 2, so that the temperature of the dyeing solution can be controlled. Moreover, an upper lid is provided to prevent volatilization of the solvent, so that variation in the concentration of the dyeing solution can be restrained and fluctuation in the characteristic of the resultant color filter can be restrained.

Figure 7:
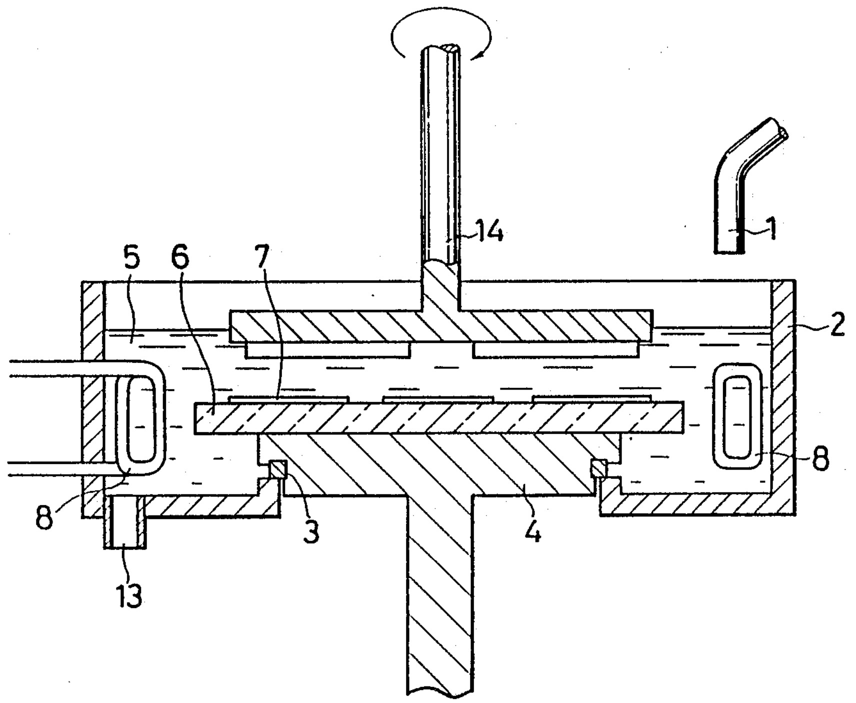
FIG. 7 is a sectional view showing a color filter dyeing apparatus of a further embodiment of the invention.

In the various embodiments described, it is possible that the dyeing solution stagnates on the substrate except where the substrate is rotated during the dyeing. The stagnation of the dyeing solution may cause reduction in efficiency of dyeing and fluctuation in the characteristics, such as the spectral characteristics, of the resultant color filter. To prevent the stagnation of the dyeing solution, an agitator for agitating the dyeing solution may be provided as shown in FIG. 7. In FIG. 7, the members with referrence numerals 1 through 13 have functions similar to those of the members with identical reference numerals, of the above-described embodiments. An agitator 14 is disposed over the substrate 6. When the agitator 14 is rotated, the dyeing solution 5 is agitated, and is prevented from stagnating on the substrate 6. A heater 8 of the throw-in type is disposed to be in the dyeing solution during the dyeing. Such a heater 8 is directly in contact with the dyeing solution 5, so that response in the temperature control is improved.

In any of the embodiments, the chuck may be of the vacuum suction type or of the mechanical type. It is not necessary to affix the substrate, insofar as the chuck can support it.

If the chuck is of the type as shown is FIG. 5 which supports the substrate at the peripheral portion of the substrate, additional advantage is attained in that color filters on both surfaces of the substrate can be dyed at the same time (if color filters are formed on both surfaces), and that the color filters are not damaged.

The sealing member 3 need not be provided to be in direct engagement with the substrate. For instance, it may be provided between the chuck 4 and the dyeing solution receptacle 2. With such an arrangement, similar functions can be attained.

The temperature controller need not be in the form of heaters 8 and 9, but may be a cooler or a combination of a heater and a cooler. These may be mounted on other than the dyeing solution receptacle 2, but can be on the upper lid 11 of the chuck 4 or on both of the dyeing solution receptacle 2 and the upper lid 11. The temperature controller may be of the buried-in type, or of the type mounted outside, or of the throw-in type, or any other type.

The agitator 14 is shown to be a rotary type, but may alternatively be of the oscillating type, or of any other type.

The inlet 1 and the outlet 13 are not restricted to those of the shape or disposition as illustrated.

In the above described, the invention has been description as being applied to dyeing. The apparatus of the above description may be utilized for development by using a developing solution in place of the dyeing solution, etching of a substrate by using an etchant, stripping of resist by using a stripping solution, and any other wet processing of the substrate.

As has been described, according to the invention a container for the dyeing solution is formed of the substrate, or the chuck, and the sealing member, so that dyeing of the substrates can be done one by one, and if an inlet for a developing solution is added, the sequence of development, dyeing, and drying can be continuously conducted.

When the upper lid in engagement with the dyeing solution receptacle is provided, variation in the concentration of a solvent due to volatilization of the solvent can be restrained. Moreover, if the temperature controller such as a heater, a cooler or the like is provided, variation in the temperature of the dyeing solution can be restrained. Furthermore, if the agitator is provided, the dyeing solution is prevented from stagnating and fluctuation in the characteristic of the color filter can be restrained.

What is claimed is:

1. A method for drying a color filter on the surface of a substrate, comprising the steps of:

applying at least one substrate comprising a photosensitive filter to be dyed on a chuck;

introducing a dyeing solution into a receptacle container comprising said substrate, said chuck, and a sealing member;

monitoring at least one temperature sensor in said receptacle;

transmitting a first electrical signal from said sensor to a temperature control unit in response to the temperature of said dyeing solution;

transmitting a second electrical signal indicative of an on/off command from said temperature control unit to at least one heater located in said receptacle;

maintaining a predetermined temperature range of said dyeing solution;

soaking said substrate in said dyeing solution;

discharging said dyeing solution from said receptacle; and removing said substrate from said receptacle.

2. The method of claim 1, further comprising the additional step of:

agitating said dyeing solution on the top of said substrate.

3. A method of claim 1, wherein said layer is made from a group comprising gelatin or casein.

4. A method of claim 1, wherein said receptacle container is cup-shaped.

5. A method of claim 1, further comprising the additional step of: transferring said substrate onto said chuck manually.

6. A method of claim 1, further comprising the additional step of: transferring said substrate onto said chuck by automated means.

7. A method of claim 1, further comprising the additional step of: fixing said substrate onto said chuck by vacuum suction.

8. A method of claim 1, further comprising the additional step of: fixing said substrate onto said chuck by shaping said chuck to peripherally capture said substrate.

9. The method of claim 1, further comprising the additional step of: forming said receptacle by bringing into contact the lower surface of said substrate with said sealing member.

10. The method of claim 1, further comprising the additional step of: forming said receptacle by bringing into contact the top surface of said substrate with said sealing member.

11. The method of claim 1, further comprising the additional step of: forming said receptacle by said chuck being in intimate contact with said sealing member.

12. The method of claim 1, wherein said introduction of said dyeing solution is achieved by an inlet supply nozzle.

13. The method of claim 1, wherein said discharging of said dyeing solution is achieved by use of an outlet valve.

14. The method of claim 13, wherein said outlet valve is an electromagnetic valve.

15. The method of claim 1, wherein said removing of said substrate is achieved by manual or automatic means.

16. A method for forming a patterned color filter on the surface of a relatively small substrate, comprising the steps of:

applying a photosensitive filter carrier material substantially uniformly over the surface of the substrate, and exposing said filter carrier material so that some areas of said photosensitive filter carrier material are soluble in a predetermined liquid developing solvent and other portions thereof are not;

mounting said substrate on a rotatable and extendable shaft which extends through an aperture in a substantially concave receptacle;

applying said predetermined developing solvent onto said substrate while rotating said substrate;

retracting said substrate so that said substrate makes a substantially liquid-tight seal to said receptacle; and immersing the surface of said substrate in a dyeing material;

whereby portions of said photosensitive filter carrier material not removed by said developing solvent are dyed by said dyeing material to configure a predetermined filter pattern.

17. The method of claim 16, wherein said photosensitive filter carrier material is selected from the group comprises of gelatin or casein.

18. The method of claim 16, further comprising the additional steps, subsequent to said dyeing operation, of:

draining said dyeing material from said receptacle;

applying a cleaning solvent to the surface of said substrate;

and spinning said substrate to remove droplets thereon.

19. The method of claim 18, wherein said cleaning solvent comprises deionized water.

20. A method for forming a patterned color filter on the surface of a substrate, comprising the steps of:

(a) applying at least one photosensitive filter carrier material over the surface of a substrate;

(b) exposing said photosensitive filter carrier material so that some areas of said photosensitive filter carrier material are soluble in a predetermined liquid developing solvent and other portions thereof are not;

(c) transferring said substrate onto a rotatable chuck;

(d) fixing said substrate onto said chuck;

(e) forming a receptacle container comprising said substrate, said chuck, a sealing member and an open exit valve;

(f) introducing said developing solution by an inlet nozzle onto said substrate, while rotating said chuck; whereby the developing solution is subsequently discharged from said receptacle through said open valve;

(g) closing said outlet valve;

(h) introducing a dyeing solution into said receptacle;

(i) soaking said substrate in said dyeing solution.

21. The method of claim 20, further comprising the additional steps, subsequent to said soaking operation, of:

(j) discharging said dyeing solution from said receptacle;

(k) applying a cleaning solvent onto said substrate to wash away any residual dyeing solution;

(l) drying said substrate;

(m) removing said substrate from said receptacle.

22. The method of claim 21, wherein said cleaning solvent comprises deionized water.

23. The method of claim 21, wherein said drying is achieved by rotating said substrate.

24. The method of claim 20, wherein said filter carrier material is selected from the group comprising gelatin or casein.

25. The method of claim 20, wherein said receptacle further comprises a cover to enclose said receptacle.

26. The method of claim 20, further comprising the additional step of:

agitating said dyeing solution on top of said substrate.

27. The method of claim 20, further comprising the additional steps of:

monitoring at least one temperature sensor in said receptacle;

transmitting a first electrical signal from said sensor to a temperature control unit in response to the temperature of said dyeing solution;

transmitting a second electrical signal indicative of an on/off command from said temperature control unit to at least one heater located in said receptacle; and maintaining a predetermined temperature range of said dyeing solution.

* * * * *

UNITED STATES PATENT AND TRADEMARK OFFICE

CERTIFICATE OF CORRECTION

PATENT NO. : 4,960,658

DATED : October 2, 1990

INVENTOR(S) : Ikeno et al.

It is certified that error appears in the above-identified patent and that said Letters Patent is hereby corrected as shown below:

In Column 4, line 11, "substrate 6, Then" should read --substrate. Then--.

In Column 5, line 1, "sensor" should be changed to --sensor 10--.

In Column 5, line 67, delete "the suction of".

In Column 6, line 52, change "upper lid 11 of the chuck 4" to --upper lid of the dyeing solution receptacle 2--.

In Column 4, line 64, "solenoid valve" should be changed to --electromagnetic value--.

In Column 5, line 5, "solenoid valve" should be changed to --electromagnetic valve--.

Signed and Sealed this

Third Day of November, 1992

*Attest:*

DOUGLAS B. COMER

*Attesting Officer*

*Acting Commissioner of Patents and Trademarks*